(12) United States Patent
Chen et al.

(10) Patent No.: US 8,579,017 B2
(45) Date of Patent: Nov. 12, 2013

(54) HEAT DISSIPATION DEVICE WITH MULTIPLE HEAT SINKS

(75) Inventors: Guo Chen, Shenzhen (CN); Shi-Wen Zhou, Shenzhen (CN); Chun-Chi Chen, Taipei Hsien (TW)

(73) Assignees: Fu Zhun Precision Industry (Shen Zhen) Co., Ltd., Shenzhen (CN); Foxconn Technology Co., Ltd., New Taipei (TW)

( * ) Notice: Subject to any disclaimer, the term of this patent is extended or adjusted under 35 U.S.C. 154(b) by 1000 days.

(21) Appl. No.: 12/620,500

(22) Filed: Nov. 17, 2009

(65) Prior Publication Data

US 2011/0048681 A1 Mar. 3, 2011

(30) Foreign Application Priority Data

Aug. 26, 2009 (CN) .......................... 2009 2 0308893

(51) Int. Cl.
*F28F 7/00* (2006.01)
*H05K 7/20* (2006.01)

(52) U.S. Cl.
USPC ......................................... 165/80.3; 361/700

(58) Field of Classification Search
USPC ......................................... 361/700; 165/80.3
See application file for complete search history.

(56) References Cited

U.S. PATENT DOCUMENTS

| 6,765,794 | B1 * | 7/2004 | Inoue ............................ | 361/695 |
| 7,990,719 | B2 * | 8/2011 | Chen et al. .................... | 361/719 |
| 8,004,843 | B2 * | 8/2011 | Chen et al. .................... | 361/700 |
| 2008/0314556 | A1 * | 12/2008 | Zhou et al. .................... | 165/80.3 |
| 2009/0067131 | A1 * | 3/2009 | Yasuda et al. ................. | 361/707 |
| 2009/0151900 | A1 * | 6/2009 | Huang ........................... | 165/80.3 |
| 2010/0258287 | A1 * | 10/2010 | Chen et al. .................... | 165/185 |

FOREIGN PATENT DOCUMENTS

CN    200910302480 .6    *    6/2009

* cited by examiner

*Primary Examiner* — Brandon M Rosati
(74) *Attorney, Agent, or Firm* — Altis & Wispro Law Group, Inc.

(57) ABSTRACT

An exemplary heat dissipation device includes a connecting plate, a first heat sink, a second heat sink, and a second flattened heat pipe. The first heat sink includes a substrate mounted on a bottom of the connecting plate and a plurality of cylindrical pins inserted in the connecting plate and contacting the substrate. The second heat sink includes a heat spreader and a plurality of rectangular solid fins integrally extending from the heat spreader. The heat spreader engages in the connecting plate. The heat pipe thermally connects the substrate of the first heat sink and the second heat spreader of the second heat sink.

9 Claims, 5 Drawing Sheets

HEAT DISSIPATION DEVICE WITH MULTIPLE HEAT SINKS

BACKGROUND

1. Technical Field

The present disclosure generally relates to heat dissipation devices and, more particularly, to a heat dissipation device having a heat pipe for cooling an electronic component such as an integrated circuit package.

2. Description of Related Art

Generally, a heat dissipation device thermally contacts one or more electronic components mounted on a printed circuit board (PCB) to dissipate heat of the electronic components. A typical heat dissipation device is a heat sink. The heat sink comprises a base contacting the electronic components, and a plurality of fins extending upwardly from a top surface of the base. The heat sink is made of highly heat-conductive metal, such as copper or aluminum. However, the operating speed of many electronic components has increased markedly in recent years. A conventional heat sink, which transfers heat from electronic components only by metal conduction, may be inadequate for dissipating heat from modern electronic components. For example, the heat absorbed by the bottom of the heat sink may not be transferred to the remainder of the heat sink quickly enough.

Heat pipes have been widely used due to their excellent heat transfer properties. A typical heat pipe operates by way of phase change of working liquid sealed in a hollow tube. Various kinds of heat dissipation devices equipped with heat pipes have been devised and put into widespread use. How to enable a heat dissipation device equipped with heat pipes to provide optimal or improved performance is the goal of numerous persons skilled in the art.

Accordingly, what is needed is a heat dissipation device with heat pipes which has enhanced heat dissipation performance.

DETAILED DESCRIPTION

Figure 1:
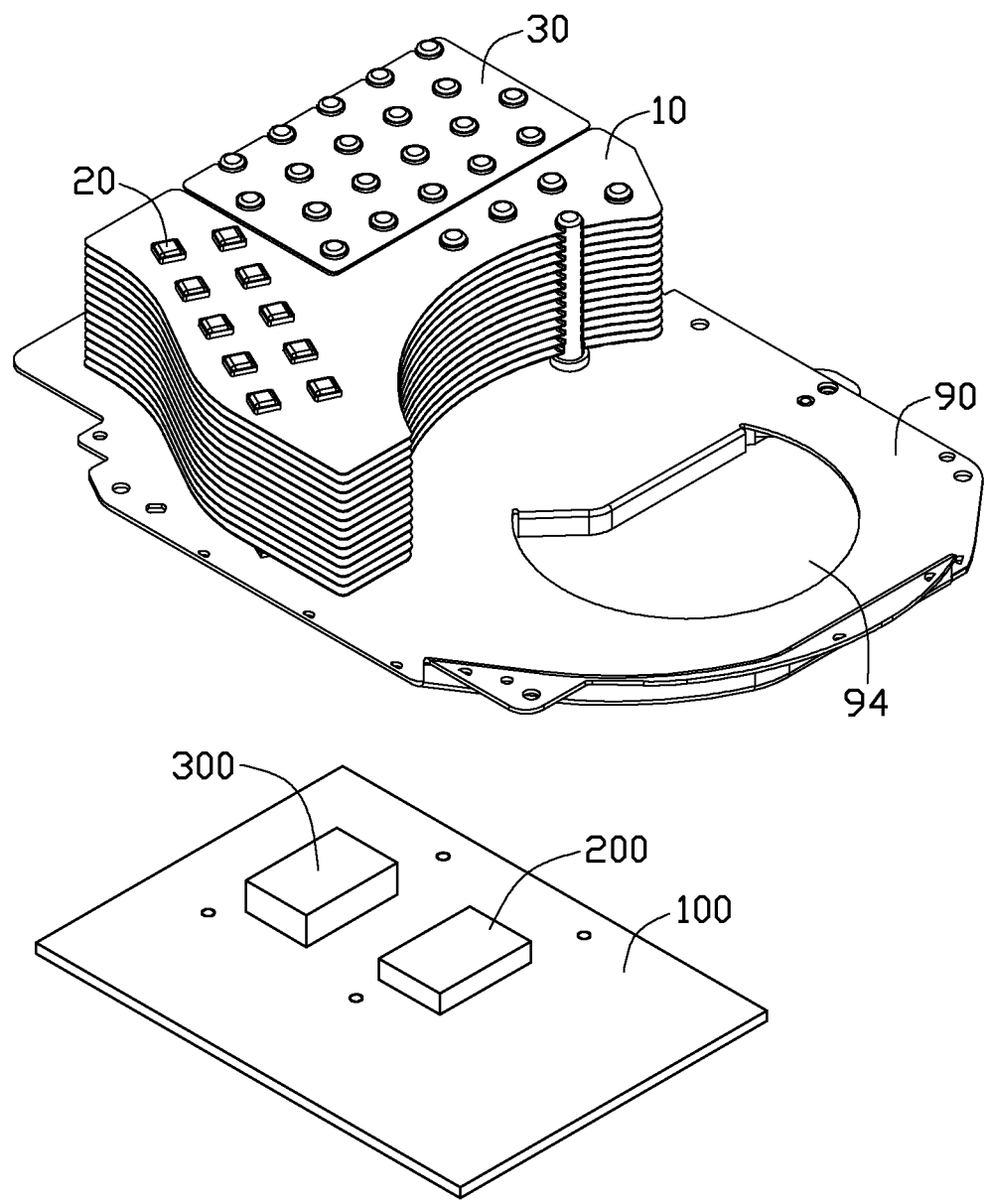
FIG. 1 is an assembled view of a heat dissipation device in accordance with an embodiment of the present disclosure, and a printed circuit board separated from the heat dissipation device, the heat dissipation device including a first heat sink, a second heat sink, and a third heat sink.

FIG. 1 illustrates a heat dissipation device in accordance with an embodiment of the present disclosure. The heat dissipation device thermally contacts a first electronic component 200 and a second electronic component 300 mounted on a printed circuit board (PCB) 100 of an electronic device (not shown) to dissipate heat generated by the first and second electronic components 200, 300. In this embodiment, the electronic device is a game player, the first electronic component 200 is a central processing unit (CPU), and the second electronic component 300 is a graphic processing unit (GPU). The first and second electronic components 200, 300 are arranged closely to each other, and both generate substantial amounts of heat. Thus, the heat generated by the first and second electronic components 200, 300 must be dissipated by the heat dissipation device quickly.

Figure 2:
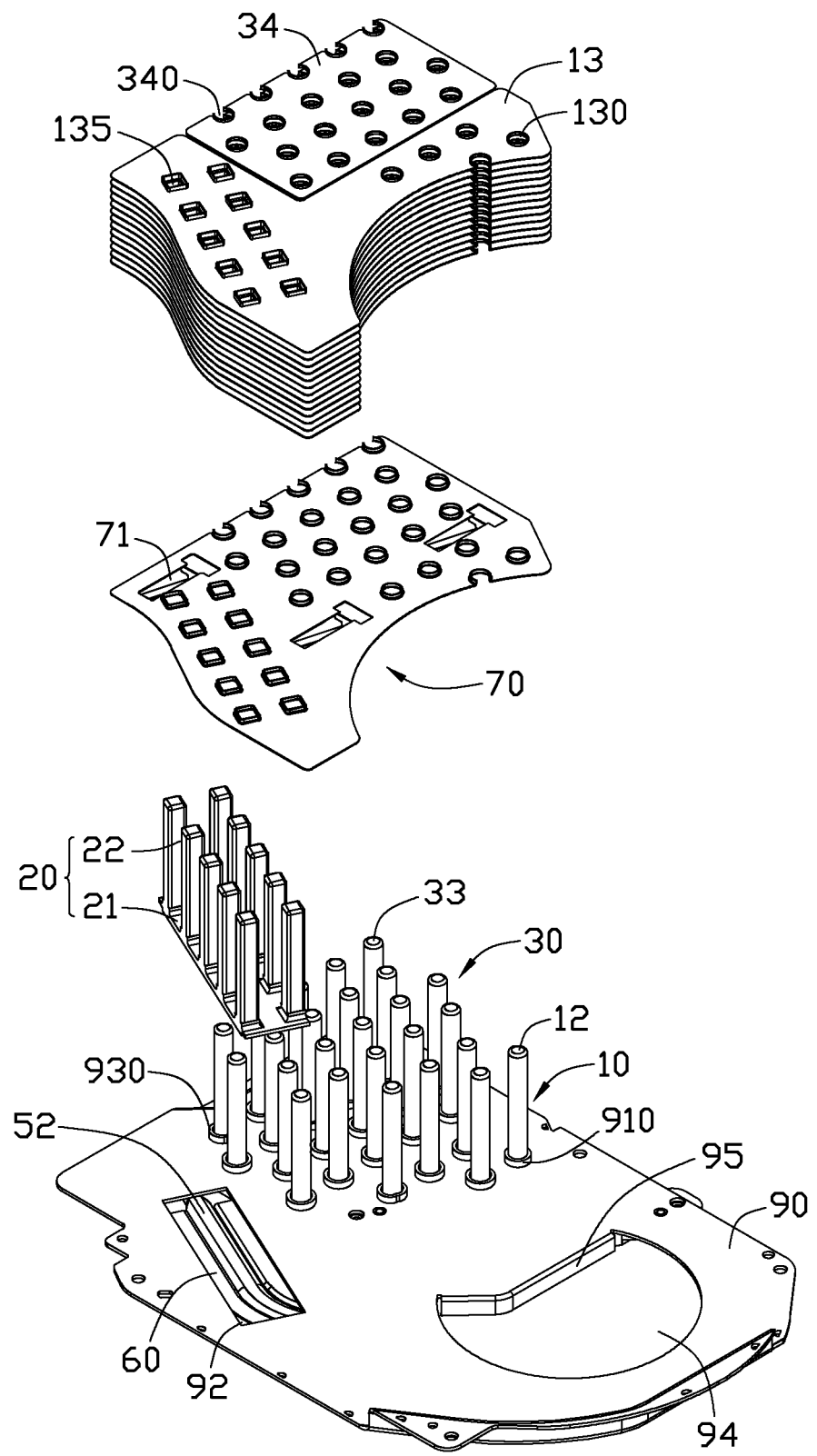
FIG. 2 is a partly exploded view of the heat dissipation device of FIG. 1, wherein first plate fins of the first heat sink, second plate fins of the third heat sink, another plate fin, and the second heat sink are separated from other parts of the heat dissipation device.
Figure 3:
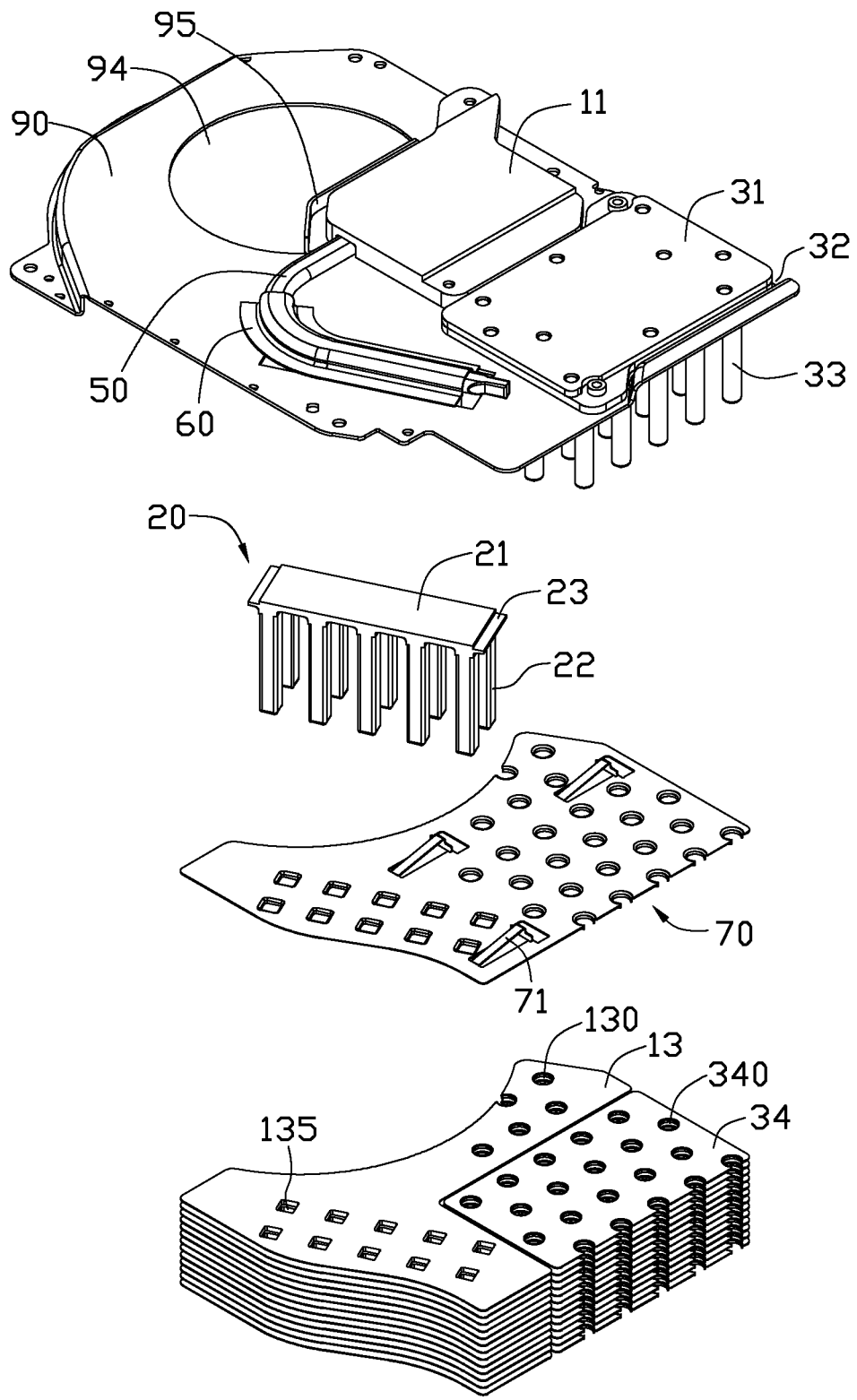
FIG. 3 is an inverted view of the heat dissipation device of FIG. 2.

Referring also to FIGS. 2-3, the heat dissipation device comprises a connecting plate 90, a first heat sink 10, a second heat sink 20, and a third heat sink 30. The first, second and third heat sinks 10, 20, 30 are mounted on the connecting plate 90. The first heat sink 10 thermally contacts the first electronic component 200. The third heat sink 30 thermally contacts the second electronic component 300. A heat pipe 50 thermally connects the first heat sink 10 and the second heat sink 20.

The connecting plate 90 is a metallic plate and has a rectangular configuration. In this embodiment, the connecting plate 90 is a bottom fan cover, provided for cooperation with a top fan cover (not shown) to guide airflow flowing to the heat sinks 10, 20, 30. A first end of the connecting plate 90 defines a semicircular opening 94 to receive a fan (not shown), which sucks airflow through the opening 94. A baffle 95 extends downwardly from an edge of the opening 94 near the first heat sink 10. A second end opposite to the first end defines a number of first through holes 91 (see FIG. 5) to engagingly receive the first heat sink 10, a rectangular opening 92 to engagingly receive the second heat sink 20, and a number of second through holes 93 to engagingly receive the third heat sink 30. The first and second through holes 91, 93 are arranged in matrixes, respectively. A first flange 910 extends upwardly from an edge around the first through hole 91, and a second flange 930 extends upwardly from an edge of the first through hole 93. The first through holes 91 are near the opening 94, and the rectangular opening 92 is located at a side of the first and second through holes 91, 93.

The first heat sink 10 is mounted on a middle portion of the connecting plate 90. The first heat sink 10 comprises a substrate 11, a plurality of cylindrical pins 12 arranged on the connecting plate 90, a plurality of first plate fins 13 engaged on the cylindrical pins 12, and a heat pipe 50 attached to bottoms of the connecting plate 90 and the substrate 11. The cylindrical pins 12 interferentially extend through the through holes 91 of the connecting plate 90, thereby securing the cylindrical pins 12 on the connecting plate 90. Bottoms of the cylindrical pins 12 are coplanar with the bottom of the connecting plate 90. The substrate 11 has a rectangular shape and is made of material having good heat conductivity, such as copper. A top of the substrate 11 contacts the bottom of the connecting plate 90; wherein a part of the top of the substrate 11 contacts the bottom of the cylindrical pins 12, and another part of the substrate 11 defines a groove 110 to thermally receive the heat pipe 50.

The first plate fins 13 are parallel to and spaced from each other. Each of the first plate fins 13 has a generally T-shaped configuration. A portion of the first plate fins 13 facing the opening 94 of the connecting plate 90 defines an arc-shaped boundary of the first plate fins 13, and an opposite portion of the first plate fins 13 defines a right angle L-shaped boundary of the first plate fins 13. Each of the first plate fins 13 defines a plurality of holes 130. The cylindrical pins 12 extend through the holes 130 of the first plate fins 13 and interferentially engage with the first plate fins 13. A lateral portion of each first plate fin 13 defines a plurality of rectangular holes 135 corresponding to a configuration of the second heat sink 20. Alternatively, the shapes of the holes 130, 135 can be changed relative to corresponding shapes of the first plate fins 13 and the second heat sink 20.

The second heat sink 20 is integrally made of material having good thermal conductivity, such as copper, aluminum or an alloy thereof. The second heat sink 20 includes a heat spreader 21, and a plurality of rectangular solid fins 22 integrally and upwardly extending from the heat spreader 21. The heat spreader 21 has a rectangular shape corresponding to the rectangular opening 92 of the connecting plate 90. The heat spreader 21 has two wings 23 extending from two lateral portions thereof. Each wing 23 has a bottom surface slightly higher than a bottom surface of the heat spreader 21, whereby the heat spreader 21 forms two stepped portions to tightly engage into the rectangular opening 92 of the connecting plate 90.

Figure 4:
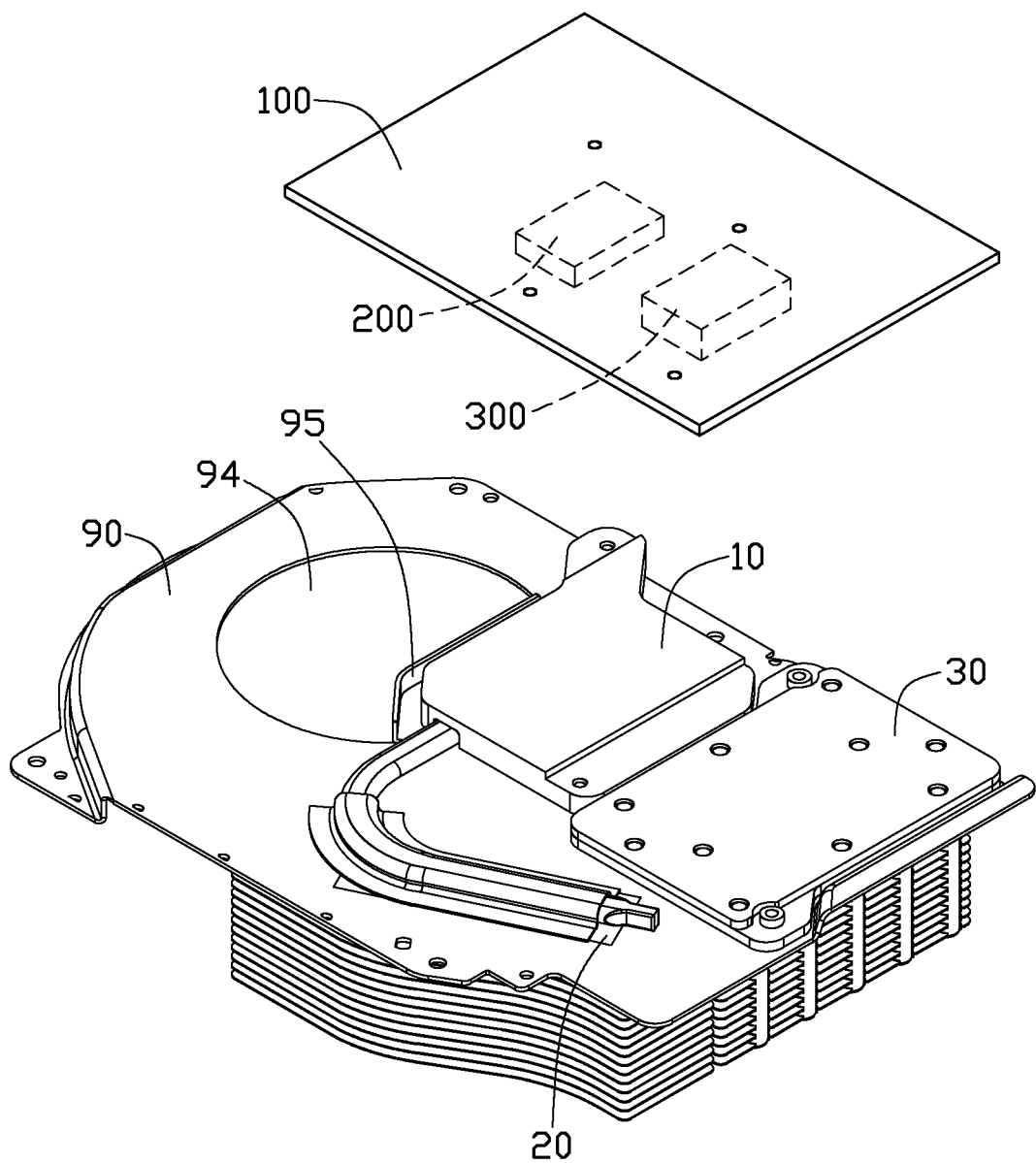
FIG. 4 is an inverted view of the heat dissipation device and printed circuit board of FIG. 1.
Figure 5:
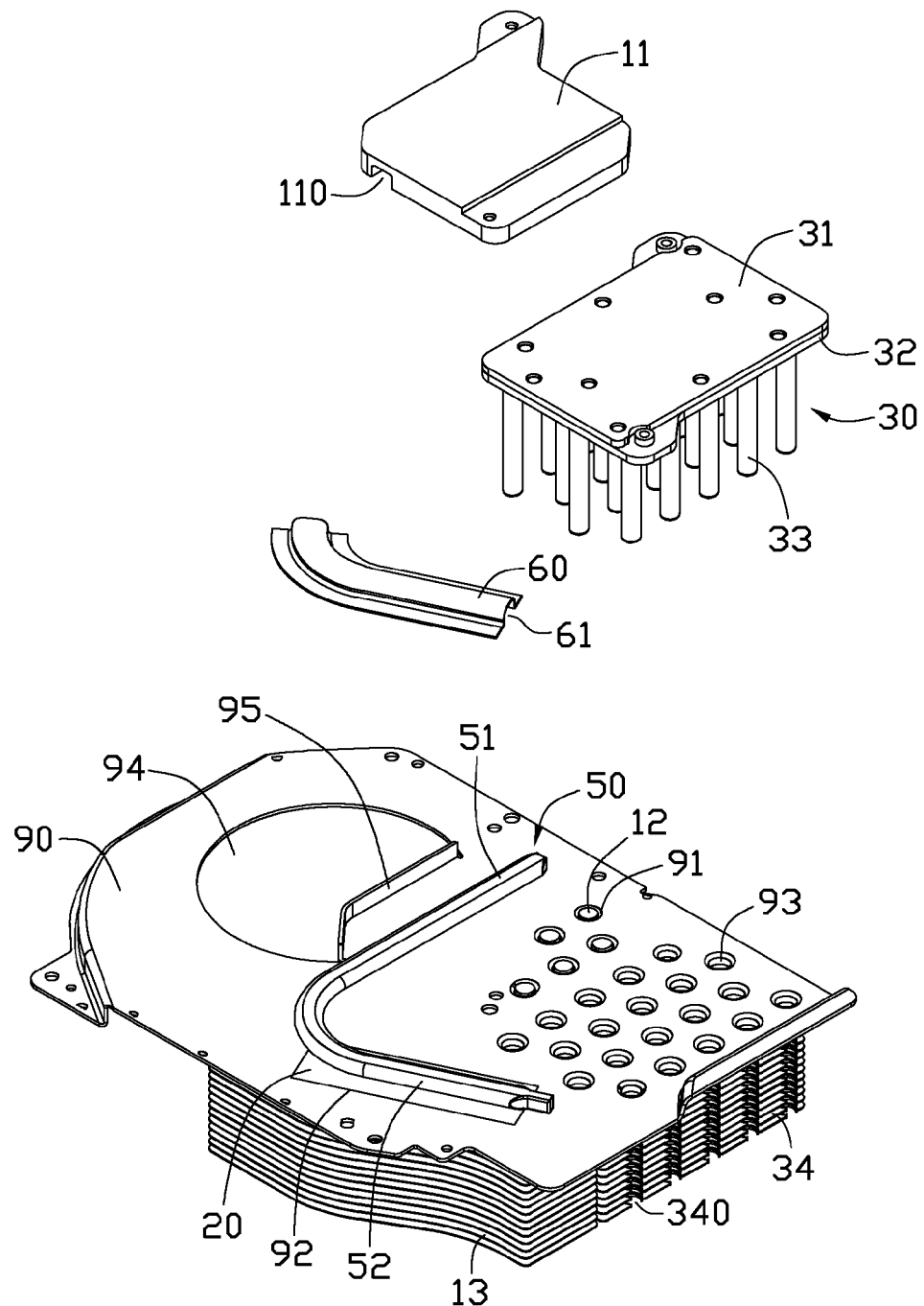
FIG. 5 is similar to FIG. 4, but showing a substrate of the first heat sink, the second heat sink, and a thermal cover separated from other parts of the heat dissipation device.

Also referring to FIGS. 4-5, the heat pipe 50 is L-shaped and flattened. The heat pipe 50 comprises an evaporating section 51 received in a groove 110 of the substrate 11, and a condensing section 52 connecting with the evaporating section 51. The condensing section 52 thermally contacts the bottom surface of the heat spreader 21 to thereby transfer heat to the second heat sink 20. A thermal cover 60 is mounted on the condensing section 52 of the heat pipe 50. The thermal cover 60 is made from a metal plate having good thermal conductivity. In the present embodiment, the thermal cover 60 has a generally omega-shaped (Ω-shaped) or n-shaped cross-section. A middle portion of the thermal cover 60 is concave-shaped, with the concavity facing downwardly, thereby defining a groove 61. The condensing section 52 of the heat pipe 50 is received in the groove 61, and the outer surface of the condensing section 52 of the heat pipe 50 intimately contacts the middle portion of the thermal cover 60. Two lateral portions of the thermal cover 60 are attached to the bottom surface of the heat spreader 21 to transfer heat from the heat pipe 50 to the second heat sink 20. In addition, the thermal cover 60 can protect the heat pipe 50.

The third heat sink 30 comprises a bottom plate 31, a top plate 32 secured on and covering the bottom plate 31, a plurality of cylindrical pins 33 engaged with the bottom and top plates 31, 32, and a plurality of second plate fins 34 engaged on the cylindrical pins 33. The cylindrical pins 33 extend through the through holes 93 of the connecting plate 90. The third heat sink 30 can move along the cylindrical pins 33 relative to the connecting plate 90, thereby adjusting a height of the bottom surface of the bottom plate 31 relative to the substrate 11 of the first heat sink 10. Thus, the substrate 11 of the first heat sink 10 intimately contacts the first electronic component 200 and simultaneously the bottom plate 31 intimately contacts the second electronic component 300. Each of the second plate fins 34 has a rectangular shape, and defines a plurality of through holes 340 to engagingly receive the cylindrical pins 33.

In assembly, the cylindrical pins 12 are interferentially engaged in the connecting plate 90. The second heat sink 20 is mounted in the rectangular opening 92 of the connecting plate 90, with the bottom surface of the heat spreader 21 being coplanar with the bottom surface of the connecting plate 90. The heat pipe 50, the substrate 11 and the thermal cover 60 are soldered on the bottom surface of the connecting plate 90, with the heat pipe 50 thermally connecting the substrate 11 and the second heat sink 20. The first plate fins 13 are engaged on the cylindrical pins 12 and the rectangular solid fins 22. Finally, the assembly of the cylindrical pins 33 with the bottom and top plates 31, 32 of the third heat sink 30 is engaged with the connecting plate 90 and interferentially engaged on the second plate fins 34. In this embodiment, the lowest first plate fin 13 and the lowest second plate fin 34 are integrally formed as a single plate fin 70. The plate fin 70 defines a plurality of holes formed by punching, thereby providing a plurality of downwardly bent T-shaped tabs 71. The tabs 71 elastically contact the connecting plate 90 and thereby form an electrical connection with the connecting plate 90, to remove static electricity from the first and second electronic components 200, 300.

When the first electronic component 200 works, a part of the heat accumulated on the substrate 11 is absorbed by the evaporating section 51 of the heat pipe 50 and transferred to the second heat sink 20 and the first plate fins 13 via the condensing section 52 of the heat pipe 50 and the thermal cover 60. Another part of the heat accumulated on the substrate 11 is transferred to the first plate fins 13 via the cylindrical pins 12. Thus the heat generated by the first electronic component 200 can be quickly and evenly transferred to the whole of each of the first plate fins 13. When the second electronic component 300 works, the heat is transferred to the second plate fins 34 via the bottom plate 31 and the cylindrical pins 33.

It is to be understood, however, that even though numerous characteristics and advantages of various embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A heat dissipation device adapted to dissipate heat generated by an electronic component mounted on a printed circuit board, the heat dissipation device comprising:
   a connecting plate;
   a first heat sink comprising:
      a substrate mounted on a bottom of the connecting plate; and
      a plurality of cylindrical pins inserted in the connecting plate and contacting the substrate;
   a second heat sink comprising a heat spreader and a plurality of rectangular solid fins integrally extending from the heat spreader, the heat spreader engaging in the connecting plate; and
   a flattened heat pipe thermally connecting the substrate of the first heat sink and the second heat spreader of the second heat sink.

2. The heat dissipation device as claimed in claim 1, wherein the heat spreader has a bottom surface coplanar with a bottom surface of the connecting plate, and the heat pipe is attached to the bottom surfaces of the heat spreader and the connecting plate.

3. The heat dissipation device as claimed in claim 2, further comprising a thermal cover, wherein the thermal cover intimately contacts an outer surface of the heat pipe and the bottom surface of the connecting plate.

4. The heat dissipation device as claimed in claim 3, wherein the thermal cover has a generally n-shaped cross-section.

5. The heat dissipation device as claimed in claim 1, wherein the connecting plate defines a rectangular opening, and the heat spreader has two wings extending therefrom to tightly engage the heat spreader in the rectangular opening of the connecting plate.

6. The heat dissipation device as claimed in claim 1, further comprising a plurality of plate fins, wherein the plate fins interferentially engage on the cylindrical pins of the first heat sink and the rectangular solid fins of the second heat sink.

7. The heat dissipation device as claimed in claim 6, wherein a lowest one of the plate fins forms a plurality of oblique tabs elastically contacting the connecting plate.

8. The heat dissipation device as claimed in claim 1, wherein the connecting plate is a metallic plate.

9. The heat dissipation device as claimed in claim 1, further comprising a third heat sink adapted to dissipate heat generated by another electronic component mounted on the printed circuit board.

* * * * *